(12) United States Patent
Loh et al.

(10) Patent No.: US 7,777,996 B2
(45) Date of Patent: Aug. 17, 2010

(54) CIRCUIT PROTECTION SYSTEM

(75) Inventors: William M. Loh, Fremont, CA (US);
Ken Doniger, Menlo Park, CA (US);
Payman Zarkesh-Ha, Milpitas, CA (US); Jau-Wen Chen, Milpitas, CA (US); Choshu Ito, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 46 days.

(21) Appl. No.: 11/174,135

(22) Filed: Jun. 30, 2005

(65) Prior Publication Data

US 2007/0019345 A1    Jan. 25, 2007

(51) Int. Cl.
*H02H 9/00* (2006.01)

(52) U.S. Cl. .......................................... 361/56

(58) Field of Classification Search ..................... 361/56
See application file for complete search history.

(56) References Cited

U.S. PATENT DOCUMENTS

| | | | | |
|---|---|---|---|---|
| 4,821,320 A * | 4/1989 | Andert et al. | ............... | 379/437 |
| 5,907,464 A * | 5/1999 | Maloney et al. | ............. | 361/111 |
| 6,144,257 A * | 11/2000 | Bouras et al. | ............... | 330/277 |
| 6,529,359 B1 * | 3/2003 | Verhaege et al. | ............ | 361/100 |
| 2003/0043523 A1 * | 3/2003 | Hung et al. | .................. | 361/111 |
| 2003/0057888 A1 * | 3/2003 | Archenhold et al. | ........ | 315/291 |
| 2004/0128625 A1 * | 7/2004 | Zhao et al. | ...................... | 716/1 |
| 2004/0240129 A1 * | 12/2004 | Moldauer et al. | ............. | 361/56 |
| 2005/0128664 A1 * | 6/2005 | Pilling et al. | .................. | 361/56 |

OTHER PUBLICATIONS

Ruud et al.; An Overview of Structured Digital ASIC XPRess Array; IEEE 2005 Custom Integrated circuits conference.*
Doug Conner; Reconfigurable logic: hardware speed with software flexibility; EDN Access for designer, by design; Mar. 28, 1996.*
Maxim Integrated Products, Application Note 639: Maxim leads the Way in ESD Protection, Oct. 3, 2000.*

* cited by examiner

*Primary Examiner*—Jared J Fureman
*Assistant Examiner*—Nicholas Ieva
(74) *Attorney, Agent, or Firm*—Cochran Freund & Young LLC

(57) ABSTRACT

A system and method for protecting a circuit. The system includes a protection circuit that includes an inverter and a capacitor coupled to the inverter. The inverter and the capacitor are implemented using logic circuits of a circuit core, and the inverter shunts electrostatic discharge ESD current through the capacitor. According to the system and method disclosed herein, because the protection circuit shunt circuit shunts ESD current using logic circuits of the circuit core, ESD protection is achieved while not requiring large FETs. Also, the protection circuit protects circuits against ESD events that conventional FET cannot protect.

18 Claims, 5 Drawing Sheets

300

CIRCUIT PROTECTION SYSTEM

FIELD OF THE INVENTION

The present invention relates to integrated circuits, and more particularly to a system and method for protecting a circuit from electrostatic discharge.

BACKGROUND OF THE INVENTION

Electrostatic discharge (ESD) is a well-known problem. The problem of ESD continues to grow as integrated circuit dimensions continue to decrease. This ESD trend continues, especially with circuits having ultra-thin gate oxides. A conventional solution is to use direct ESD current shunting between VDD and VSS. FIG. 1 is a schematic diagram of a conventional ESD protection circuit 50. The ESD protection circuit 50 includes an input/output (I/O) protection circuit 60, which includes two diodes 62 and 64 coupled to an I/O pad 66, and a core power clamp 70, which includes a field effect transistor (FET) 72. In operation, generally, the ESD protection circuit 50 protects a circuit core 80 by shunting ESD current 82 caused by an ESD event 90 such as a voltage spike. The specific operation of the ESD protection circuit 50 is well known. The circuit core 80 is clocked with a system clock (not shown). The core power clamp 70 is referred as a "direct shunt," because the FET 72 of the core power clamp 70 shunts the ESD current 82 directly from VDD to VSS. The shunting occurs when the FET 72 turns on, and the FET 72 turns on when the voltage at VDD exceeds a trigger voltage, or "snapback voltage." Such a voltage is caused by an ESD event. When the FET 72 turns on, it provides a low-resistance path for the ESD current 82 to be discharged from VDD to VSS.

FIG. 2 is a schematic diagram illustrating a voltage spike 92, which attenuates due to an inductance (L) impeding current 94 in the ESD protection circuit 50 of FIG. 1. A problem with the ESD protection circuit 50 is that localized voltage spikes can still damage some gate oxides. Voltage spikes 92 typically attenuate due an inductance (L) blocking current 94 at high frequency, which can occur during a charge device model (CDM) event. CDM is a form of ESD, and is well known. Because the inductance blocking current 94 occurs at a high frequency, the FET 72 cannot sense the attenuated voltage spike 92' fast enough, if at all. As a result, some gate oxides in the circuit core 80 can still get damaged. The ESD protection circuit 50 is unable to prevent such failures.

Another problem with the ESD protection circuit 50 is that the ESD protection circuit 50 requires the FET 72 to be large enough to shunt sufficient current 82 away from the circuit core 80. Large FETs are undesirable, because large FETs take up a large amount of valuable space on a chip.

Another problem with the ESD protection circuit 50 is that if the operating voltage is lowered for low-power applications, the current sinking and voltage handling capabilities of the ESD protection circuit 50 are lowered. This is because the FET 72 switches more slowly when its operating voltage is lowered.

Accordingly, what is needed is an improved system and method for protecting a circuit from ESD. The system and method should be simple, cost effective and capable of being easily adapted to existing technology. The present invention addresses such a need.

SUMMARY OF THE INVENTION

A system and method for protecting a circuit is disclosed. The system includes a protection circuit that includes an inverter and a capacitor coupled to the inverter. The inverter and the capacitor are implemented using logic circuits of a circuit core, and the inverter shunts electrostatic discharge ESD current through the capacitor.

According to the system and method disclosed herein, because the protection circuit shunt circuit shunts ESD current using logic circuits of the circuit core, ESD protection is achieved while not requiring large FETs. Also, the protection circuit protects circuits against ESD events that conventional FET cannot protect.

DETAILED DESCRIPTION OF THE INVENTION

The present invention relates to integrated circuits, and more particularly to a system and method for protecting a circuit from electrostatic discharge. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

A system and method in accordance with the present invention for protecting a circuit from ESD are disclosed. The system includes a protection circuit that shunts ESD current using exiting circuitry in the circuit core. As a result, ESD protection is achieved while not requiring large FETs. Also, the protection circuit protects circuits against ESD events that conventional FET cannot protect.

Although the present invention disclosed herein is described in the context of ESD, the present invention may also apply to the protection of electrical overstress (EOS), and still remain within the spirit and scope of the present invention.

Figure 1:
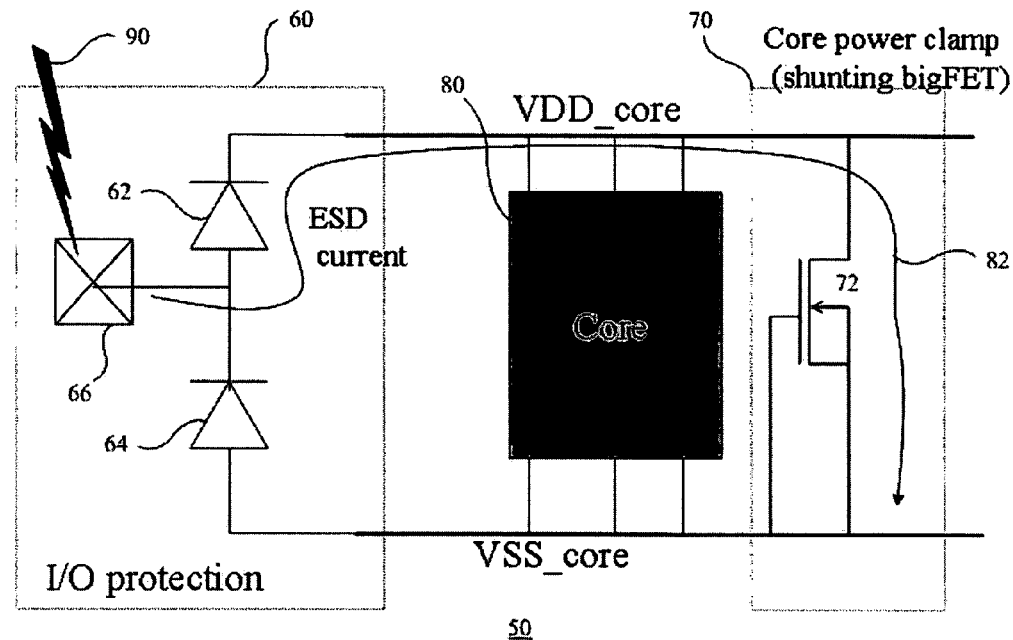
FIG. 1 is a schematic diagram of a conventional ESD protection circuit.
Figure 2:
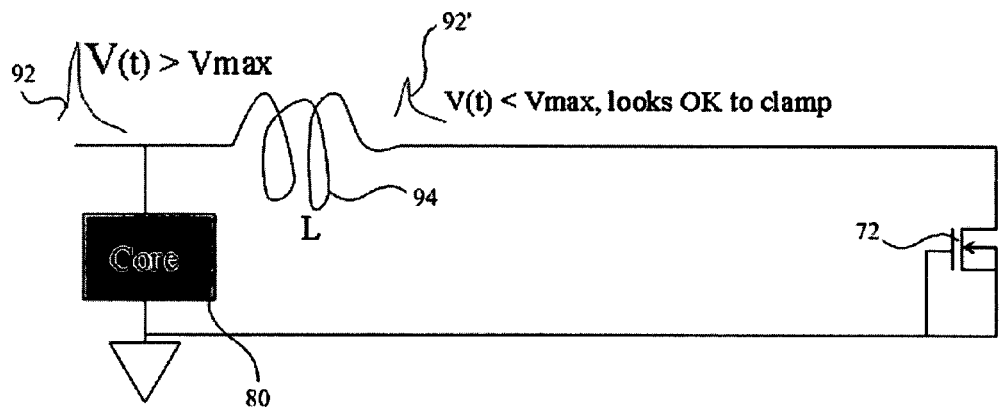
FIG. 2 is a schematic diagram illustrating a voltage spike caused by an inductance (L) impeding current in the ESD protection circuit of FIG. 1.
Figure 3:
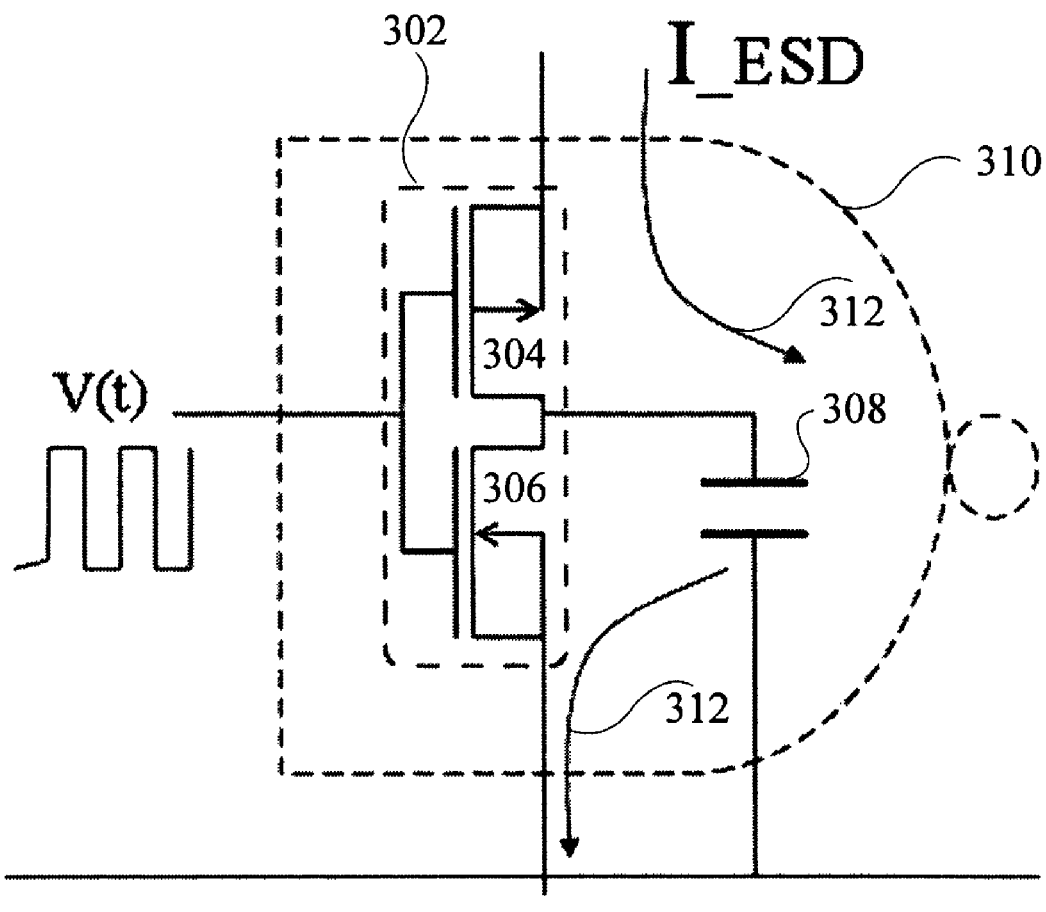
FIG. 3 is a schematic diagram of a protection circuit, in accordance with the preferred embodiment.

FIG. 3 is a schematic diagram of a protection circuit 300, in accordance with the preferred embodiment. The protection circuit 300, also referred to as a switching core 300, includes an inverter 302, which includes a PMOS transistor 304 and an NMOS transistor 306, and a capacitor 308. The protection circuit 300 is implemented using existing logic circuits (e.g.

logic gates) in the circuit core. In this specific example, the protection circuit 300 is implemented using the circuitry of a NAND device 310. In operation generally, as the inverter 302 switches, the inverter 302 switches shunts ESD current 312 through the capacitor 308.

Figure 4:
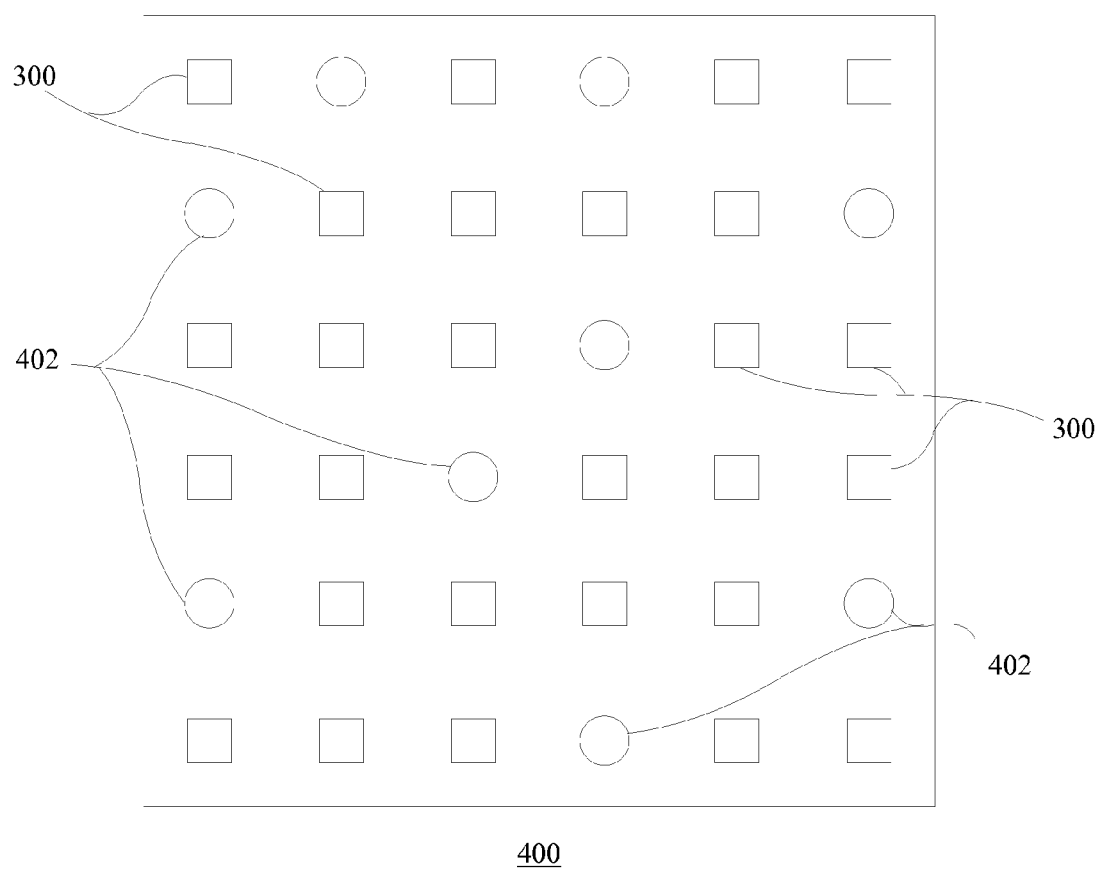
FIG. 4 is a schematic diagram of a circuit core in which the protection circuit of FIG. 3 can be implemented, in accordance with the preferred embodiment.

FIG. 4 is a schematic diagram of a circuit core 400 in which the protection circuit 300 of FIG. 3 can be implemented, in accordance with the preferred embodiment. The circuit core 400 includes multiple protection circuits 300 and multiple protection clock systems 402 used to clock the protection circuits 300. Each protection clock system 402 clocks one or more protection circuits 300. The specific number of protection circuits 300 that are clocked by one protection clock system 402 will depend on the specific implementation. Each of the protection circuits 300 is implemented using existing logic circuits of the circuit core 400. The cumulative effect of all of the protection circuits 300 sufficiently shunts any ESD current that may occur in the circuit core 400. As a result, ESD protection is achieved while not requiring additional ESD protection elements such as large FETs.

Figure 5:
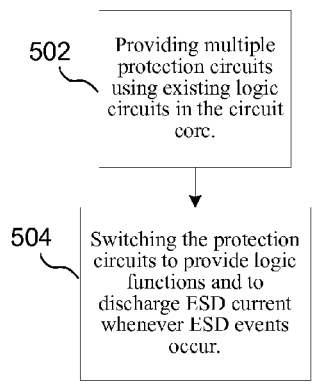
FIG. 5 is a flow chart showing a method for protecting a circuit, in accordance with the preferred embodiment.

FIG. 5 is a flow chart showing a method for protecting a circuit, in accordance with the preferred embodiment. Referring to FIGS. 3, 4, and 5, the process begins in step 502 where multiple protection circuits 300 are provided using existing logic circuits in the circuit core 400. The protection circuits 300 are distributed at multiple locations throughout the circuit core 400. Next, in a step 504, the protection circuits 300 switch to provide logic functions during normal operation and to shunt ESD current during an ESD event. Accordingly, the protection circuits 300 that are implemented using existing logic circuits of the circuit core 400 (e.g. core transistors and capacitors) have multiple functions.

Each protection circuit 300 functions as a shunting resistor, where the resistance is the inverse of the product of the capacitance and the switching frequency associated with each gate. The shunting resistance of each gate is high, in the order of kilo- to mega-ohms. Since the total number of protection circuits 300 includes tens or hundreds of millions of these gates, the protection circuits 300 as a group deliver tens of milli-ohms of shunting resistance in parallel. Because the core gates of the protection circuits 300 are well distributed throughout the circuit core 400, the protection circuits 300 provide localized shunting coverage that conventional direct shunting FETs cannot provide. The protection circuits 300 also provide local low-impedance shunting during the switching of core gates of the circuit core 400. For example, a Pentium 4 sinks 50 amps at 1V at 15% gate switching activity, i.e. a 20 milli-ohm shunt resistor.

The triggering of the protection circuits 300 can occur in a number of ways, depending on the specific embodiment. In accordance with the preferred embodiment, the protection circuits 300 are preferably always on, unless the protection circuits 300 are locked out. The protection circuit 300 does not operate during the normal operation of circuit core 400, and vice versa, because the two operations are mutually exclusive. The protection circuit 300 relies on a boot-strapping type of self-powering and takes advantage of the ESD charging that results in a voltage difference between power and ground. Accordingly, the protection circuit 300 is always on but the protection circuit 300 will not have any action until the protection circuit 300 senses an ESD event by detecting the voltage difference between power and ground. This provides the fastest possible trigger. The protection circuits can be locked out simply by using a separate lockout pin for power sequencing and other non-ESD events.

Figure 6:
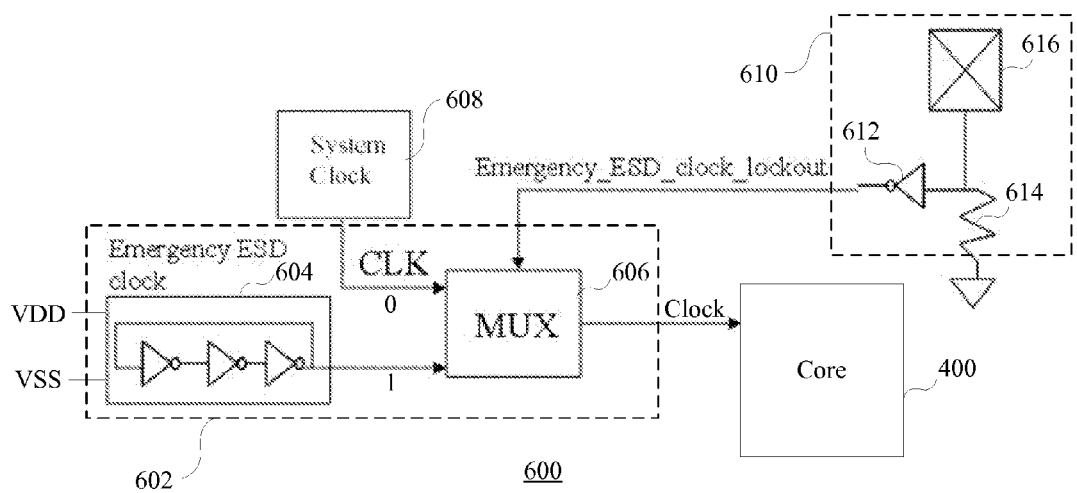
FIG. 6 is a schematic diagram of a clocking circuit used to clock the protection circuit of FIG. 3, in accordance with the preferred embodiment.

FIG. 6 is a schematic diagram of a clocking circuit 600 used to clock the protection circuit 300 of FIG. 3, in accordance with one embodiment. The clocking circuit 600 includes an ESD protection clock system 602, which includes an ESD protection clock 604 and a multiplexer 606. The multiplexer 606 receives a clock signal from the ESD protection clock 604, a clock signal from a system clock 608, and an emergency ESD clock lockout signal from a trigger circuit 610. In accordance with this specific embodiment of the present invention, the trigger circuit 610 functions as an always-on trigger circuit and includes an inverter 612, a pull-down resistor 614, and a lockout pin 616. The multiplexer 606 outputs a selected clock signal to the circuit core 400 (FIG. 4).

Because of the random logic nature of circuits of the circuit core 400 in which the protection circuit 300 can be implemented, any switching will most likely result in sinking current. The logic circuits of the circuit core 400 can switch as fast as possible without regard to signal integrity constraints in order to sink as much current as possible.

The clock signal from the ESD protection clock 604 can be locally generated by any astable circuit such as a ring oscillator or phase locked loop (PLL). Alternatively, the ESD protection clock 604 can also be digital. In operation, the ESD protection clock 604 produces an "emergency" ESD protection clock signal that is multiplexed with a signal from the system clock 608. The multiplexing is controlled by the lockout pin 616 through the inverter 612.

The term emergency denotes the state during which the system is being attacked by an ESD pulse, which has been sensed and is being dealt with by the switching on of the protecting circuit 300. The function of the lockout pin 616 is to prevent the clock signal from the ESD protection clock 604 from being selected during normal operation. If the lockout pin 616 is not driven high (e.g. when the chip is not powered), the clock signal from the ESD protection clock 604 is selected. In other words, if the lockout pin 616 is low, the MUX selector signal is high (i.e. "1") and the Emergency ESD clock is thus selected. Conversely, if the lockout pin 616 is high, the MUX selector signal is low (i.e. "0") and the system clock 608 is thus selected.

The maximum frequency at which the protection circuits 300 switch is much higher than normal operation frequency, and switching at maximum frequency ensures that that voltage buildup between VDD & VSS does not exceed a particular threshold (e.g. 1.5*VDD). In accordance with one embodiment, all core gates of the circuit core 400 (FIG. 4) are driven by the ESD protection clock 604 during an ESD event.

The ESD protection clock 604 is independent from the system clock 608. This independent clocking renders delays and other timing issues associated with the system clock irrelevant. Accordingly, using the signal from the ESD protection clock 604 provides low latency. While using the trigger circuit 610 is fast, it may be more optimal in some applications (e.g. application-specific integrated circuits) to not use an always-on trigger. If the protection circuits 300 are not always on, the protection circuits 300 are triggered (i.e. turned on) in order to sink current. The voltage at which the protection circuits 300 turn on can be predetermined (e.g. 2V). In accordance with alternative embodiments, various trigger circuits can also be used to trigger the protection circuit 300.

Figure 7:
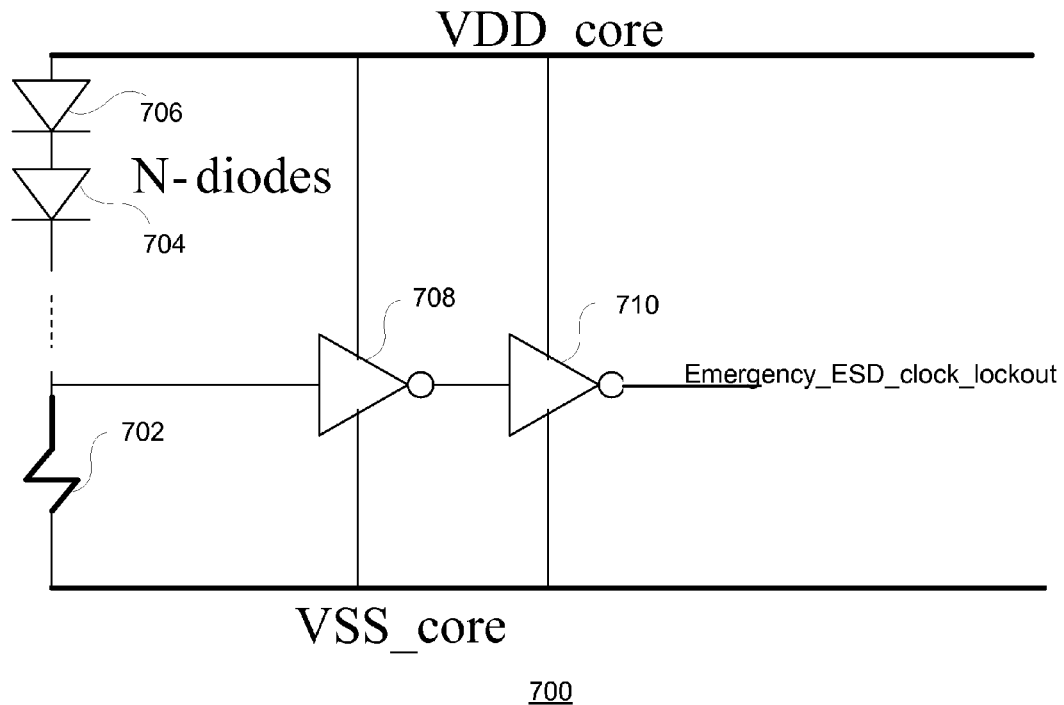
FIG. 7 is a schematic diagram of a trigger circuit used to trigger the protection circuit of FIG. 3, in accordance with one embodiment.

FIG. 7 is a schematic diagram of a trigger circuit 700 used to trigger the protection circuit 300 of FIG. 3, in accordance with one embodiment. Referring both FIGS. 6 and 7 together, the trigger circuit 700 may be used in lieu of the trigger circuit 610 when an always-on trigger scheme not desired. The trigger circuit 700 includes a resistor 702, one or more diodes 704 and 706, and at least two inverters 708 and 710. The trigger circuit 700 circuit is a resistor-diode trigger circuit. The number of diodes determines the turn-on voltage (e.g. 2V) on the VDD_core to produce a high output signal (i.e. emergency_ESD_clock_lockout). If VDD_core is below this turn-on voltage, the output signal will be low and the switching circuit will not turn on. When VDD_core is raised by the ESD pulse above the turn-on voltage, the output will be high, the Emergency ESD clock 604 will be selected, and the circuit core 400 of FIG. 4 will switch to shunt current from VDD_core to VSS_core. This alternate triggering scheme of FIG. 7 has the advantage in that the trigger circuit 700 does not require power sequencing, which may be required in always-on (lockout-pin) implementations.

While an always-on approach is preferably used to trigger the protection circuit 300 of FIG. 3, and while the trigger circuit 700 may also provide triggering, one of ordinary skill in the art will readily realize that other circuits and methods can also be used to provide triggering and still remain within the spirit and scope of the present invention. For example, in accordance another embodiment of the present invention, a scan test mode can be used to trigger the protection circuit 300 to achieve continuous toggling in order to draw maximum current. During the scan test, the gates of the core circuit 400 are toggled, which sinks potential ESD current.

The logic circuits in the circuit core 400 are typically clocked using a system clock. In accordance with the preferred embodiment, the logic circuits that are used to implement the protection circuits 300 are clocked by a separate and independent clock, or "ESD protection clock," as described above.

Figure 8:
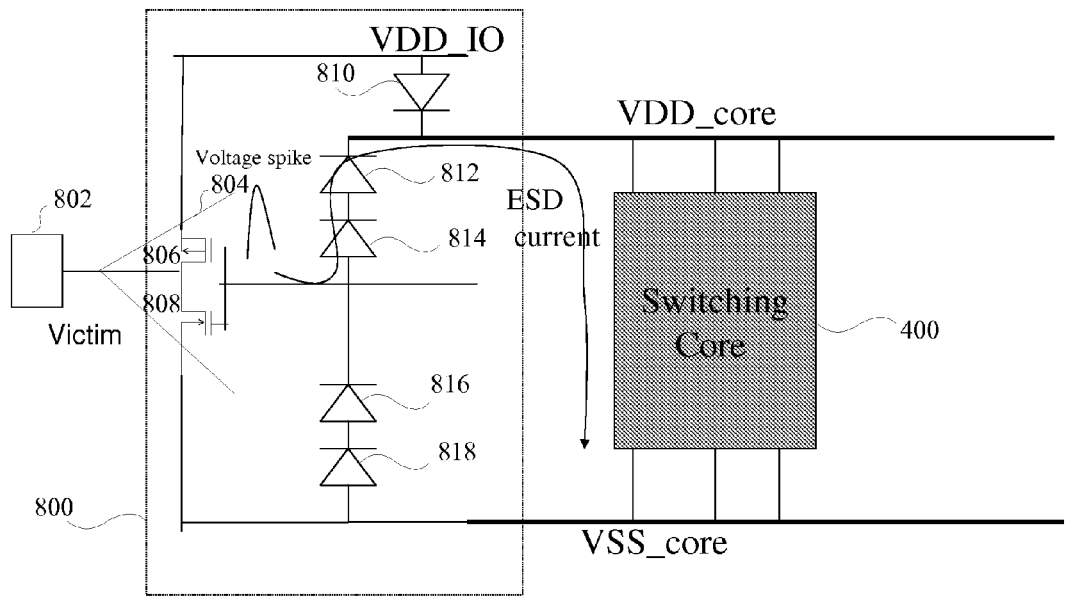
FIG. 8 is schematic diagram of an I/O circuit with which the protection circuit of FIG. 3 can be implemented, in accordance with one embodiment.

FIG. 8 is schematic diagram of an I/O circuit 800 with which the protection circuit 300 of FIG. 3 can be implemented, in accordance with one embodiment. The I/O circuit 800 couples between an input/output (I/O) pad 802 and the circuit core 400, which includes the protection circuits 300 (FIGS. 3 and 4). The I/O circuit 800 includes an inverter 804, which includes a PMOS transistor 806 and an NMOS transistor 808, and diodes 810, 812, 814, 816, and 818. I/O circuits are well known. FIG. 8 is provided to show how the circuit core 400 couples to the I/O pad 802.

According to the system and method disclosed herein, the present invention provides numerous benefits. For example, the protection circuits 300 provide very low shunting resistance as hundreds of millions of transistors of the circuit core 400 may be switching to shunt ESD current. Furthermore, localized ESD current is shunted to prevent localized voltage spikes. Furthermore, ESD shunting increases as the number of protection circuits 300 increase. And furthermore, because the protection circuits 300 are implemented using existing circuits of the circuit core 400, there are minimal disruptions in the design infrastructure.

A system and method for protecting a circuit from electrostatic discharge has been disclosed. The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

We claim:

1. A protection circuit comprising:
   an astable on-chip ESD protection clock circuit that generates an ESD protection clock during an ESD event;
   a system clock;
   an inverter selectively coupled to the ESD protection clock and the system clock based on a lockout signal; and
   a capacitor coupled to the inverter, wherein the inverter and the capacitor are implemented using existing logic circuits of a circuit core such that the inverter provides logic functions when selectively coupled to the system clock, and wherein the ESD protection clock when selectively coupled to the inverter causes the inverter to periodically switch during the ESD event thereby shunting electrostatic discharge (ESD) current to the capacitor during the ESD event such that localized ESD protection is achieved within the circuit core.

2. The circuit of claim 1 further comprising a trigger circuit that controls, via the lockout signal, the selective coupling of the ESD protection clock and the system clock to the inverter.

3. The circuit of claim 2 wherein the trigger circuit comprises:
   a resistor-diode circuit; and
   at least two inverters coupled to the resistor-diode circuit.

4. The circuit of claim 1 wherein the protection circuit is triggered during a scan test mode.

5. The circuit of claim 1 further comprising:
   a multiplexer coupled to the ESD protection clock;
   said system clock is coupled to the multiplexer; and,
   wherein the ESD protection clock is independent from the system clock.

6. The circuit of claim 5 wherein the ESD protection clock circuit comprises a phase locked loop.

7. The circuit of claim 5 further comprising a trigger circuit that controls, via the lockout signal, the selective coupling of the ESD protection clock and the system clock to the inverter.

8. A system comprising:
   a system clock;
   a circuit core comprising a plurality of protection circuits, each of the plurality of protection circuits comprising,
      an astable on-chip ESD protection clock circuit that generates an ESD protection clock during an ESD event;
      an inverter selectively coupled to the ESD protection clock and said system clock based on a lockout signal, and
      a capacitor coupled to the inverter, wherein the inverter and the capacitor are implemented using existing logic circuits of the circuit core such that the inverter provides logic functions when selectively coupled to the system clock, and wherein the ESD protection clock when coupled to the inverter causes the inverter to periodically switch during the ESD event thereby shunting electrostatic discharge (ESD) current to the capacitor during the ESD event such that localized ESD protection is achieved within the circuit core.

9. The system of claim 8 wherein the plurality of protection circuits are distributed throughout the circuit core.

10. The system of claim 8 further comprising a trigger circuit that controls, via the lockout signal, the selective coupling of the ESD protection clock and the system clock to the inverter.

11. The system of claim 10 wherein the trigger circuit comprises:
   a resistor-diode circuit; and
   at least two inverters coupled to the resistor-diode circuit.

12. The system of claim 8 wherein the plurality of protection circuits are triggered during a scan test mode.

13. The system of claim 8 further comprising:
   a multiplexer coupled to the ESD protection clock;
   said system clock is coupled to the multiplexer; and,
   wherein the ESD protection clock is independent from the system clock.

14. The system of claim 13 wherein the ESD protection clock circuit comprises a phase locked loop.

15. The system of claim 13 further comprising a trigger circuit that controls, via the lockout signal, the selective coupling of the ESD protection clock and the system clock to the inverter.

16. A method for protecting a circuit, the method comprising:
provided a plurality of protection circuits using existing logic circuits in a circuit core, wherein each one of the plurality of protection circuits comprise a logic circuit, and a capacitor coupled to the output of the logic circuit; and
switching the logic circuits according to a system clock selectively coupled to the logic circuits based on a lockout signal to provide logic functions; and,
periodically switching the logic circuits during an ESD event according to an ESD protection clock generated by an on-chip astable ESD clock generation circuit, and selectively coupled to the logic circuits based on a lockout signal, to shunt electrostatic discharge (ESD) current during the ESD event, wherein localized ESD protection is achieved within the circuit core by the shunting of the ESD current during the ESD event by the logic circuits being periodically switched during the ESD event.

17. The method of claim 16 further comprising triggering the plurality of protection circuits using a trigger circuit that controls, via the lockout signal, the selective coupling of the ESD protection clock and the system clock to the inverter.

18. The method of claim 16 wherein the ESD protection clock is independent from said system clock.

* * * * *